(12) United States Patent
Nürnberger et al.

(10) Patent No.: US 11,473,187 B2
(45) Date of Patent: *Oct. 18, 2022

(54) VAPORIZER BODY

(71) Applicant: KENNAMETAL SINTEC KERAMIK GMBH, Schongau (DE)

(72) Inventors: Michael Hans Nürnberger, Marktredwitz-Brand (DE); Rudolf Karl Grau, Neustadt a.d. Aisch (DE); Hubert Josef Schweiger, Füssen (DE)

(73) Assignee: KENNAMETAL SINTEC KERAMIK GMBH, Schongau (DE)

( * ) Notice: Subject to any disclaimer, the term of this patent is extended or adjusted under 35 U.S.C. 154(b) by 371 days.

This patent is subject to a terminal disclaimer.

(21) Appl. No.: 16/685,596

(22) Filed: Nov. 15, 2019

(65) Prior Publication Data

US 2020/0080190 A1 Mar. 12, 2020

Related U.S. Application Data

(63) Continuation of application No. 12/865,817, filed as application No. PCT/EP2009/052876 on Mar. 11, 2009, now Pat. No. 10,513,771.

(30) Foreign Application Priority Data

Apr. 1, 2008 (DE) ........................ 10 2008 016619.7

(51) Int. Cl.
*C23C 14/24* (2006.01)

(52) U.S. Cl.
CPC .................. *C23C 14/243* (2013.01)

(58) Field of Classification Search
CPC ..... C23C 14/243; C23C 14/246; C23C 14/24; C23C 14/26; C23C 14/543
USPC ........ 392/386, 387, 388, 389, 403; 118/667, 118/724, 726, 727; 427/255.6, 576, 532, 427/597, 579
See application file for complete search history.

(56) References Cited

U.S. PATENT DOCUMENTS

| | | | |
|---|---|---|---|
| 3,514,575 A | 5/1970 | Passmore | |
| 3,725,045 A | 4/1973 | Bourne | |
| 4,811,691 A * | 3/1989 | McJilton | C23C 14/246 118/726 |
| 5,198,032 A | 3/1993 | Kleyer | |
| 2006/0162662 A1* | 7/2006 | Sato | C23C 14/243 118/726 |

(Continued)

FOREIGN PATENT DOCUMENTS

| | | |
|---|---|---|
| DE | 1771968 | 1/1972 |
| DE | 4128382 | 7/1992 |

(Continued)

OTHER PUBLICATIONS

Jan. 27, 2022 Non-Final OA—U.S. Appl. No. 16/685,596.

(Continued)

*Primary Examiner* — Phuong T Nguyen
(74) *Attorney, Agent, or Firm* — Larry R. Meenan

(57) ABSTRACT

A vaporizer body (1) having a vaporizing surface (3) for vaporizing metal in a PVD-metallization installation, wherein the vaporizing surface (3) comprises a plurality of recesses (5, 5', 5"), with an opening of the respective recess having an area/perimeter-ratio of greater than or equal to 1.5 mm.

17 Claims, 5 Drawing Sheets

(56) References Cited

U.S. PATENT DOCUMENTS

Figure 1A:
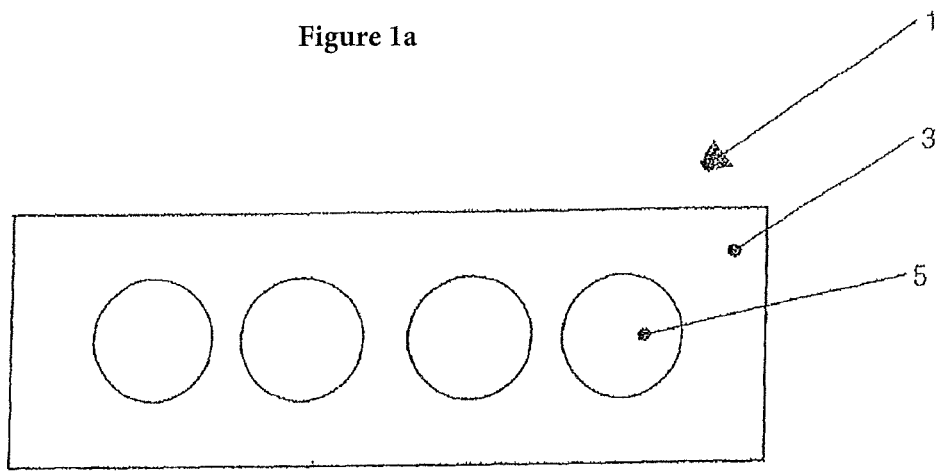

2007/0110412 A1    5/2007  Rusinko et al.
2008/0245305 A1*  10/2008  Ikarashi ................ H05B 3/141
                                                        118/726
2011/0013891 A1    1/2011  Nürnberger et al.

FOREIGN PATENT DOCUMENTS

| DE | 202005020544 | 4/2006 |
| DE | 102005057220 | 6/2007 |
| EP | 1683886 | 7/2006 |
| EP | 1688514 | 8/2006 |
| JP | 2006225757 | 8/2006 |
| JP | 2007128898 | 5/2007 |
| WO | WO2005049881 | 6/2005 |

OTHER PUBLICATIONS

Jun. 14, 2017 Advisory Action (PTOL-303) 2 US App. No. 20110013891.
Apr. 6, 2017 Final Office Action 2 US App. No. 20110013891.
Oct. 11, 2016 Office action (3 months) 2 US App. No. 20110013891.

* cited by examiner

VAPORIZER BODY

The present invention relates to a vaporizer body.

CROSS-REFERENCE TO RELATED APPLICATIONS

This application is a continuation of U.S. patent application Ser. No. 12/865,817, filed Aug. 2, 2010, which is a national stage entry of International Application No. PCT/EP2009/052876, filed Mar. 11, 2009, which claims priority to German Application No. 10 2008 016 619.7, filed Apr. 1, 2008, each of which are incorporated herewith by reference in their entireties.

A common method for coating flexible substrates with metals is the so-called vacuum band metallization according to the PVD (physical vapor deposition) technology. Suitable flexible substrates are for example paper, plastic foils and textiles, and aluminum is mostly used as metal. Such coated substrates are widely used for wrapping and decoration purposes, for the production of capacitors and in environmental technology (insulation).

The coating of the flexible substrates takes place in so called metallization installations. In the metallization installation, the substrate to be coated is directed/guided over a cooled roll and meanwhile exposed to a metal vapor which condensates on the surface of the substrate as a thin metal layer. For generating the required vapor flow of metal, resistance-heatable vaporizer bodies are used, e.g. in the form of so called vaporizer boats, which are heated to approximately 1450-1600° C. using a direct current flow. A metal wire is supplied to the vaporizing surface (usually this is the upper side of the vaporizer body), is liquefied on the vaporizing surface, and is vaporized under vacuum at approximately $10^{-4}$ mbar.

According to the PVD technology non-flexible substrates are coated batch wise in a discontinuous process, for example by means of flash vaporization. Non-flexible substrates are for example TV-screens and plastic parts.

For example, conventional vaporizer bodies consist of a hot-pressed ceramic material, the main components of which are titanium diboride and boron nitride and/or aluminum nitride. In this connection, titanium diboride is the electrically conductive component, and boron nitride and/or aluminum nitride are the electrically insulating component. When mixed together, these components result in specific electrical hot-resistances of 600-6000 µOhm*cm, wherein a mixing ratio of conducting component to non-conducting component is respectively 50 mass % (+/−10 mass %).

In practice, a frequently occurring problem is the wetting of the vaporizing surface of the vaporizer body with/by the metal to be vaporized, in particular the initial wetting at the beginning of the metallization process. As a result, merely reduced vaporization rates (kilogram metal/time unit) can be realized at the beginning of the metallization process due to a smaller/reduced wetting surface. Further, when the vaporizing surface is wetted non-uniformly and incompletely, the problem exists that the conductibility of the vaporizer body, which in total is electrically conductive, changes due to the metal to be vaporized being in contact with the vaporizer body (parallel resistance). Namely, the conductibility changes irregularly depending on the amount and extension of supplied and vaporized metal. Accordingly, it is necessary to re-adjust the supply of current to the vaporizer body in order to be able to maintain a uniform vaporizing rate.

Therefore, in prior art a layer structure is often applied to the surface of the vaporizer body forming the vaporizing surface in order to improve the wettability with the metal to be vaporized.

Further, two-part vaporizer boats are known, having an electrically conducting vaporizer body core part and an electrically insulating vaporizer body outer part which receives/encases the core part, wherein the outer part of the vaporizer body is made of a wetting promoting material.

Further, from EP 1 688 514 A1 a ceramic vaporizer boat is known, the vaporizing surface of which is provided with a plurality of grooves/channels. The grooves are arranged such that they are not parallel to the direction of current flow, that is, the grooves are inclined with regard to the longitudinal axis of the vaporizer boat. The grooves have a width of 0.1 to 1.5 mm, a depth of 0.03 to 1 mm, and a length of at least 1 mm. The grooves are supposed to improve wetting with liquid aluminum during vaporization operation. In particular, according to EP 1 688 514 A1, the grooves shall suppress/reduce a wetting of the vaporizing surface in a longitudinal direction of the vaporizer body and shall promote a wetting of the vaporizing surface in a cross-direction of the vaporizer body, that is, by means of the grooves a wider/broadened wetting of the vaporizer surface shall be obtained. This is mainly achieved by the following two effects. On the one hand, a kind of capillary action is achieved by the small width of the grooves, so that liquid aluminum in the grooves is "pulled" towards the longitudinal ends of the grooves. On the other hand, the temperature within the grooves increases due to the reflection of heat radiation at the side walls of the grooves. An increased temperature reduces the wetting angle so that wetting with the metal is improved.

Figure 7:
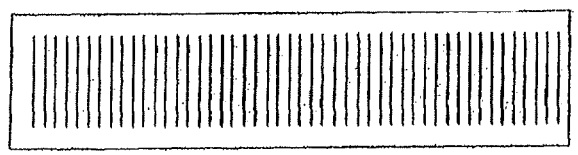
Figure 7:
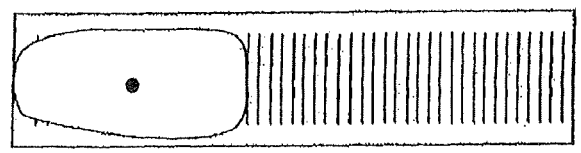

Such a prior art vaporizer body is shown in FIG. 7, wherein the grooves are formed as transverse channels.

These known vaporizer boats have the disadvantage of a complex production since a great number of relatively thin grooves have to be provided on the vaporizing surface. A further disadvantage is the fact that in a longitudinal direction of the vaporizer boat a uniform metal bath or metal melt is only formed, if the metal wire is supplied to a central position in the longitudinal direction. This is because, starting from the contacting point of the metal wire, the metal bath extends towards both sides with an equal longitudinal extension. As shown in FIG. 7, the vaporizing surface of the vaporizer boat will be incompletely wetted by the metal (in particular in the longitudinal direction), if the contacting point of the metal wire is not arranged in the center. Such a unilateral wetting has the effect that the metal bath flows onto the water-cooled copper fixation at one of the longitudinal sides, wherein the opposite side remains unwetted. Now, the opposite side overheats since a cooling effect by the liquid metal melt is missing.

From DE 20 2005 020 544 U1 a vaporizer device is known containing a crucible having a melting zone and a vaporizing zone which is in connection with the melting zone.

DE 10 2005 057 220 A1 discloses a receptacle for vaporizing metal, wherein a plurality of grooves is formed on the bottom of the vaporizing surface.

It is an object of the present invention to provide a relatively insensitive vaporizer body which is easy to operate and which allows an appropriate (i.e. substantially uniform and complete) wetting of the vaporizing surface with metal in both longitudinal direction and cross direction of the vaporizer body, irrespective of the contacting point of the metal wire or the location of metal supply. Further, the vaporizer body shall be easy and cheap to manufacture.

To this end, the present invention provides a vaporizer body according to claim 1. Further embodiments of the vaporizer body according to the present invention are described in the dependent claims.

The vaporizer body according to the present invention comprises a vaporizing surface from which metal supplied thereto may be vaporized. For example, metal, such as aluminum, in the form of a metal wire may be supplied to the vaporizing surface. Alternatively or additionally, metal which is already molten may be supplied to the vaporizing surface. In case of a metal wire, the metal supplied to the vaporizing surface is first liquefied/molten on the hot vaporizing surface, and is subsequently vaporized.

According to the invention the vaporizing surface comprises a plurality of recesses, for example two to five recesses. Each recess has an opening with an area/perimeter ratio of greater than or equal to 1.5 mm, e.g. greater than or equal to 2 mm, e.g. greater than or equal to 3 mm. If for example a recess having a circular opening is provided, the radius of the opening is at least 3 mm. If for example a recess is provided having an opening with the shape of a circular ring, the width of the ring of the opening is at least 3 mm. If for example a recess having a square opening is provided, the side length of the opening is at least 6 mm.

The recesses have a wetting promoting effect which is primarily based on a change of the wetting angle at the edge between a sidewall of the recess and an adjacent part of the vaporizing surface. At this edge the liquid metal is dammed and flows along the edge and around the opening, so that the molten metal initially wets the vaporizing surface primarily along the edge. The wetting of the recess by "overhanging" dammed metal takes place substantially abrupt. The area/perimeter ratio of greater than or equal to 1.5 mm promotes a wetting of the vaporizing surface in both a longitudinal direction and a transverse direction of the vaporizer body. Further, such recesses turned out to be able to achieve a uniform and large-area wetting of the vaporizing surface even if the metal is not centrally supplied so that an overflow of the metal mold is prevented. That is, the liquid metal substantially wets the entire vaporizing surface even if the point where the metal wire contacts the vaporizing surface is not in a center of the vaporizer surface. Therefore, the vaporizer body is easy to use and insensitive under operating conditions. Further, the recesses are easy to manufacture.

For example, a cavity may be formed on the vaporizing surface, the plurality of recesses being formed in/on the bottom surface of the cavity. The cavity forms a boundary for the molten metal and prevents a lateral overflow of the molten metal.

For example, the recesses may have a depth of 0.05 to 1 mm. For example, the recesses have a depth of 0.15 to 0.4 mm.

For example, the sidewall of the respective recess or depression may form an angle of 80 to 150° with the part of the vaporizing surface which is adjacent to the recess. The change of the wetting angle for the liquid metal at the edge is then (180-80)°=100° to (180-150)°=30°. For example, the angle may be in the range of 90 to 135°, for example in the range of 90 to 1200. In this connection, for example, the angle may be selected so that accumulation of molten metal at the edge between the sidewall and the adjacent part of the vaporizing surface is promoted, that is, so that a flow of molten metal into the recess is impeded, so that during operation of the vaporizer body the molten metal initially flows mainly along the edge which is formed by the sidewall and the part of the vaporizing surface which is adjacent thereto (in the following upper edge of the recess) and around the recess.

For example, the sidewall of the respective recess may be partially/sectionally curved or consistently curved. For example, the sidewall may be curved at least in a portion adjacent to the bottom surface of the recess, that is, in a portion of the edge between the bottom surface and the sidewall of the recess. Thereby, occurrence of hot-spots during operation of the vaporizer body may be prevented. If the recesses are made by milling, a corresponding milling cutter with a corner radius may be used. For example, the curvature may have a radius of 0.05 to 3 mm, for example a radius of 0.1 to 1 mm, for example 0.3 to 0.5 mm.

For example, the recesses may all have the same shape. Alternatively, the recesses may have different shapes. For example, one or more/several or all of the openings may be formed circular or in the shape of a circular ring. For example, one or more or all of the openings may have the form of an ellipse or an elliptical ring. For example, one or more or all of the openings may have the shape of an equilateral quadrilateral (for example a square) or of an equilateral quadrilateral ring, wherein two corners are arranged on the longitudinal axis of the vaporizer body so that a rhombus is formed. For example, one or more or all of the openings may have the form of an isosceles triangle or triangular ring, wherein the hypotenuse of the respective triangle/triangular ring is arranged perpendicular to the longitudinal axis of the vaporizer body.

For example, the plurality of recesses may be arranged in series in the longitudinal direction of the vaporizer body. In this connection, for example, the individual recesses may be spaced apart from each other. For example, the distance between the individual recesses may be 1 to 80 mm, for example 2 to 10 mm, for example 3 to 8 mm. The distance between the individual recesses may vary or may be constant. The individual recesses may be either separated/isolated from each other or may be connected with each other via a connecting channel. However, the individual recesses may also abut each other or partly overlap each other, thereby forming a neck. The individual recesses may be arranged substantially central in a transverse direction of the vaporizer body, that is, on the longitudinal axis/symmetry axis of the vaporizer body. However, the recesses may also be arranged so as to be offset to or displaced from the longitudinal axis/symmetry axis of the vaporizer body. Further, several recesses may be arranged in series in transverse direction of the vaporizer body.

For example, the vaporizer body may be formed as an electrically insulating vaporizer body outer part having an inner hollow space for receiving an electrically conducting resistance-heatable vaporizer body core part. In this case, the outer part is heated via the inserted core part. Alternatively, the vaporizer body may be integrally formed as an electrically conductive resistant-heatable vaporizer body. In both cases the vaporizing surface of the vaporizer body may be additionally provided with a wetting promoting layer/coating. Such a coating may also serve as a protection against abrasion and corrosion.

For example, the recesses may be formed by milling. Accordingly, an existing vaporizer body may be converted in an easy and cheap manner, to thereby form the vaporizer body according to the present invention. If the vaporizer body is formed by sintering a green body, the recesses may be formed during the forming of the green body, for example by correspondingly impressing the mass of the green body.

Thereby, post processing of the vaporizer body with a milling cutter or similar tools can be facilitated or totally omitted.

Figure 1B:
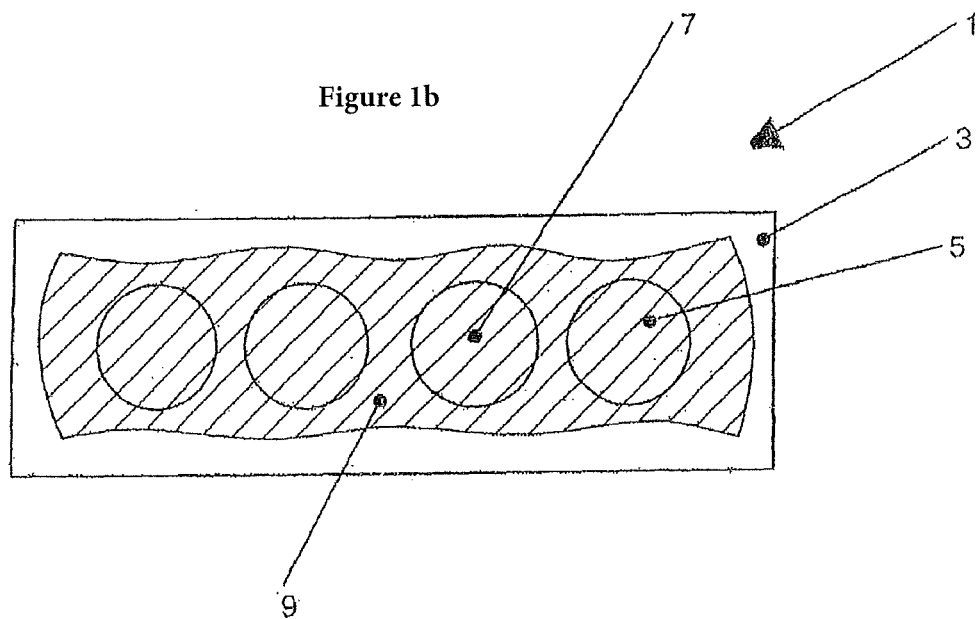
Figure 1C:
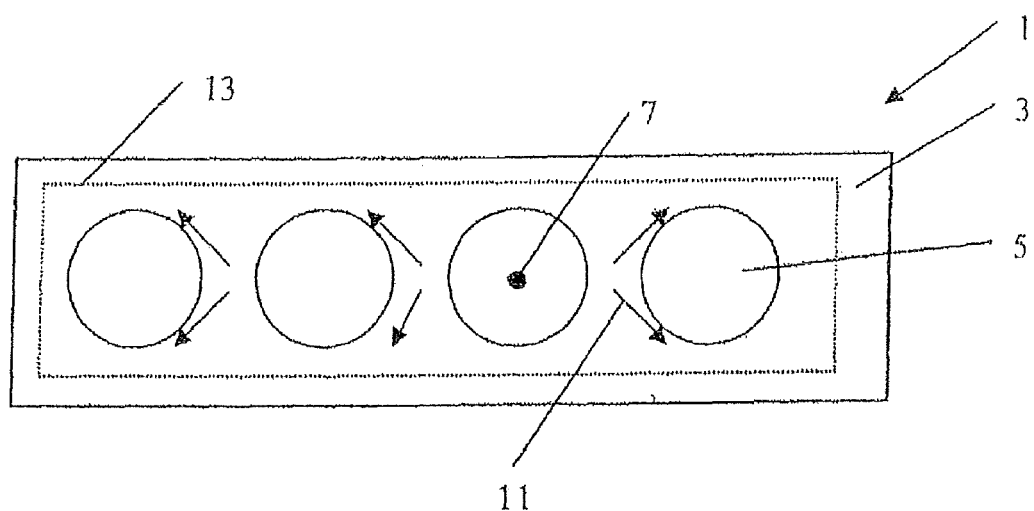
Figure 1D:
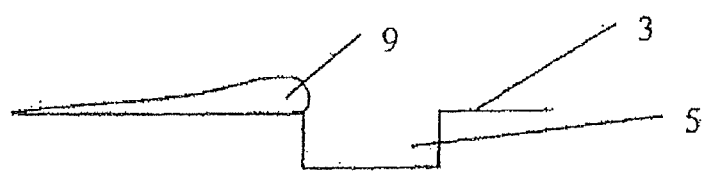
Figure 2:
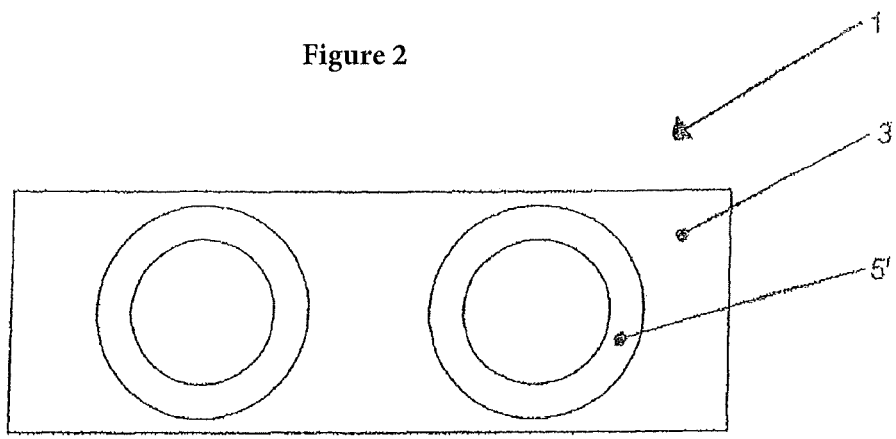
Figure 3:
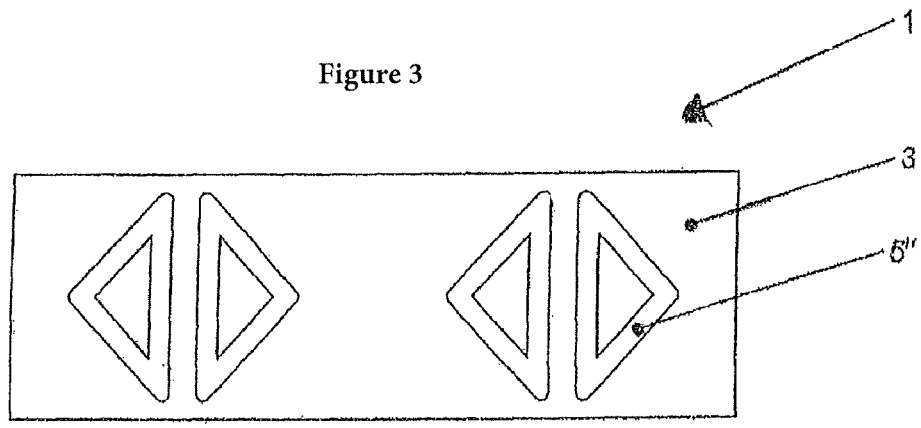
Figure 4:
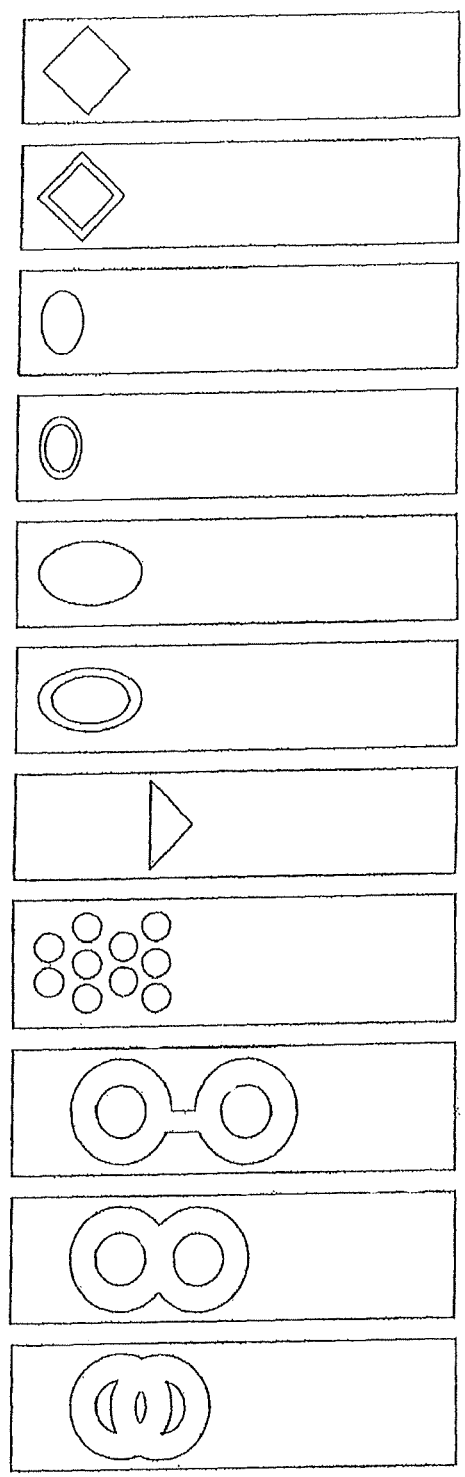
Figure 5:
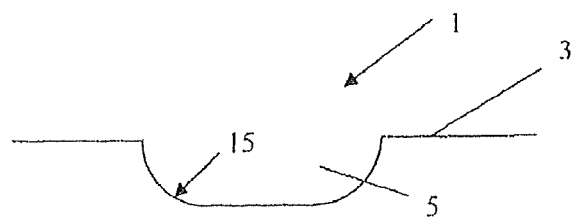
Figure 6:
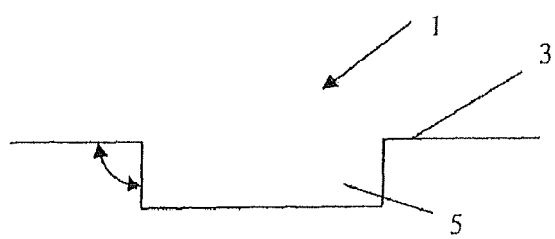

In the following the present invention is described with reference to the drawings by means of exemplary embodiments. In the drawings:

FIG. 1a shows a top view of a vaporizer body according to a first embodiment of the present invention, FIG. 1b shows a schematic top view of the vaporizer body of FIG. 1a during operation of the vaporizer body, FIG. 1c shows a further top view of the vaporizer body of FIG. 1a, FIG. 1d shows a schematic detailed view of the vaporizer body of FIG. 1a during operation of the vaporizer body, FIG. 2 shows a top view of a vaporizer body according to a second embodiment of the present invention, FIG. 3 shows a top view of a vaporizer body according to a third embodiment of the present invention, FIG. 4 shows top views of further vaporizer bodies according to the present invention, FIG. 5 and FIG. 6 respectively show a detailed view of a recess of a vaporizer body according to the present invention, and FIG. 7 shows a vaporizer body according to prior art.

FIG. 1a shows a top view of a vaporizer body according to a first embodiment of the present invention. The vaporizer body 1 is formed so as to have the shape of a so-called vaporizer boat, and consists of a hot-pressed ceramic material which contains as main components titanium diboride and boron nitride, wherein titanium diboride is the electrically conductive component, and wherein boron nitride is the electrically insulating component. The mixing ratio of conducting component to non-conducting component is 50% (+/−10%) each, resulting in a specific resistance of approximately 600 to 6000 µOhm*cm. The vaporizer body 1 is formed as a plate body, with a length of approximately 120 mm, a width of approximately 35 mm and a height of approximately 10 mm. Four cylindrical recesses or depressions 5 are formed in the vaporizing surface 3 of the vaporizer body 1, the vaporizing surface being formed by the upper side of the plate. For example, the recesses may be formed with a corresponding milling cutter. That is, according to this embodiment, each recess 5 has a circular opening and a circular bottom surface. The recesses 5 are arranged in series in the longitudinal direction of the vaporizer body and are separated from each other. According to this embodiment, the distance between the individual recesses 5 is approximately 5 mm, and the respective depth is approximately 0.3 mm. The diameter of the circular opening and the circular bottom surface of each recess is approximately 20 mm. This results in a respective area/perimeter ratio (=r/2 or d/4 for circular openings) of 5 mm.

FIG. 1b schematically shows the vaporizer body 1 of FIG. 1a during operation. Metal wire/aluminum was decentrally supplied onto the vaporizing surface 3, namely at the second recess 5 from the right side, as shown by reference sign 7. Nevertheless, a metal bath 9 could be generated which uniformly wetted/covered substantially the entire vaporizing surface 3 without overflowing. In a detailed examination it could be identified that the liquid aluminum was distributed along the respective circumference/perimeter of the opening (=edge between sidewall of the recess 5 and adjacent vaporizing surface 3) (see for example right side of the second recess from the left side). The effect which is responsible for this is shown in FIGS. 1c and 1d. As shown in FIG. 1d, the molten metal 9 initially accumulates/is dammed at the upper edge of the recess 5. This is due to a change of the wetting angle by 90° at the upper edge of the recess 5. Thereby, the molten metal 9 initially wets the vaporizing surface 3 primarily along the upper edge of the recess 5, as indicated by arrows 11 in FIG. 1c. The circular shape of the recesses 5 contributes to a particularly beneficial distribution of the molten aluminum 9 on the vaporizing surface 3. Finally, also the recesses 5 and their bottom surfaces are wetted by the molten metal 9, that is by dammed aluminum.

As indicated by the dashed line in FIG. 1c, a cavity 13 may be optionally formed on the vaporizing surface 3, the four recesses 5 being formed in/on the bottom surface of the cavity 13. The sidewall of the cavity 13 forms a barrier for the molten metal, whereby overflowing of the molten metal 9 can be prevented.

FIG. 2 shows a top view of a vaporizer body according to a second embodiment of the present invention. The vaporizer body 1 comprises a vaporizing surface 3 with two recesses 5'. The recesses 5' respectively have an opening with the shape of a circular ring and a bottom surface with the shape of a circular ring. The dimensions of the vaporizer body 1 correspond to those of the first embodiment. The outer diameter of the respective opening and bottom surface is 30 mm, the respective inner diameter being 18 mm. This results in an area/perimeter ratio of 3 mm (=ring width/2). The recesses 5' respectively have a depth of 0.3 mm. The distance between the recesses 5' is 25 mm.

FIG. 3 shows a top view of a vaporizer body according to a third embodiment of the present invention. The vaporizing surface 3 of the vaporizer body 1 comprises four recesses 5". The opening and the bottom surface of the respective recess 5" have the shape of a ring with the form of an isosceles triangle. The recesses 5" are arranged such that the hypotenuse of each triangular ring is substantially perpendicular to the longitudinal axis/symmetry axis of the vaporizer body 1. The two inner recesses 5", that is the recesses being arranged adjacent to the longitudinal centre of the vaporizer body, are arranged such that the hypotenuse faces away from the longitudinal centre. The two outer recesses 5" are arranged such that the hypotenuse faces the longitudinal centre. Two recesses 5" respectively form the shape of a rhombus. The dimensions of the vaporizer body 1 correspond to those of the first embodiment. The hypotenuse has a length of 25 mm and a width of 4 mm. The length of the two other triangular sides may be adjusted according to requirements so that an appropriate distribution of the molten metal 9 in the longitudinal direction and the transverse direction is achieved. In the embodiment shown, the surface of the triangular openings is respectively 148 mm$^2$, the perimeter/circumference being respectively 82.1 mm. This results in an area/perimeter ratio of 1.8 mm. The recesses 5" respectively have a depth of 0.3 mm. The distance between the two inner recesses 5" is 25 mm, the respective distance between inner and outer recess being 5 mm.

In the embodiments shown the number of the recesses (and also the specified size and the specified area/perimeter ratio) may be varied according to requirements. Further, different forms may be combined with each other. For example, two inner triangular recesses may be exclusively provided, or two inner triangular recesses may be combined with two outer circular recesses.

FIG. 4 shows further embodiments of the vaporizer body according to the present invention, that is, for the form of the opening of the recess, wherein—except for the last four examples—only one recess is shown per vaporizer body for simplification. Of course, the different forms of the recesses shown in FIG. 4 may be combined with each other and with the forms described above. As can be seen from FIG. 4, e.g., the opening of the recess 5 may have an elliptical form or the form of an elliptical ring. For example, the main axis of the ellipse may be perpendicular to the longitudinal axis of the vaporizer body. Alternatively, the main axis may be parallel to or inclined with regard to the longitudinal axis of the vaporizer body.

As shown in the three lower most examples of FIG. 4, for example, the at least two recesses may be in connection with each other via a connection channel or may partially overlap. For determining the respective area/perimeter ratio the circumferential line of the respective recess/opening may be simply symmetrically continued in the overlapping portion. If the two openings overlap, they form a neck/constriction or dent between the two recesses/openings. Also differently shaped openings may overlap.

The geometrical form of the recesses 5 or the openings thereof is not limited to the forms shown. In fact, also other forms/openings may be used which have an area/perimeter ratio of greater than or equal to 1.5 mm and which enable an appropriate wetting of the vaporizer body if suitably arranged on the vaporizing surface 3 of the vaporizer body 1.

FIG. 5 shows the recess 5 of a vaporizer body 1 according to the present invention in detail. The sidewall of the recess 5 has a curvature 15. Thereby, the occurrence of hot-spots in the region of the recess 5 may be prevented/reduced during operation of the vaporizer body.

FIG. 6 shows the recess 5 of a vaporizer body 1 according to the present invention in detail. The sidewall of the recess forms an angle of approximately 90° with the part of the vaporizing surface 3 which is adjacent to the recess 5, thereby promoting the accumulation/damming of the molten metal 9 at the upper edge of the recess 5 at the beginning of the operation of the vaporizer body.

The invention claimed is:

1. An electrically conducting vaporizer body for vaporizing metal, the electrically conducting vaporizer body comprising:
   a vaporizing surface for vaporizing metal in a PVD-metallization installation,
   wherein the vaporizing surface comprises:
      a plurality of circular recesses having an area/perimeter-ratio of greater than or equal to 1.5 mm;
      and surfaces outside the recesses, the plurality of recesses and the outside surfaces uniformly wetted by a molten metal bath simultaneously in longitudinal and lateral directions of the vaporizing surface, and the vaporizer body is resistance heatable.

2. The electrically conducting vaporizer body of claim 1, wherein the area/perimeter-ratio of greater than or equal to 2.

3. The vaporizer body according to claim 1, wherein the vaporizing surface comprises a cavity, the plurality of circular recesses being formed in a bottom surface of the cavity.

4. The vaporizer body according to claim 1, wherein the circular recesses have a depth of 0.05 to 1 mm.

5. The vaporizer body according to claim 1, wherein a sidewall of the circular recesses is curved at least in a portion which is adjacent to a bottom surface of the recess.

6. The vaporizer body according to claim 1, wherein the plurality of circular recesses is arranged in series in a longitudinal direction of the vaporizer body.

7. The vaporizer body according to claim 1, wherein the molten metal bath is vaporized on the outside surfaces.

8. The vaporizer body according to claim 1, wherein the outside surfaces distribute the molten metal bath around the circumference of the circular recesses.

9. The vaporizer body according to claim 1, wherein the circular recesses have a radius of at least 3 mm.

10. A method of vaporizing metal comprising:
   providing an electrically conducting vaporizer body, being resistance-heatable for vaporizing metal, the electrically conducting vaporizer body a vaporizing surface for vaporizing metal in a PVD-metallization installation, wherein the vaporizing surface comprises a plurality of circular recesses having an area/perimeter-ratio of greater than or equal to 1.5 mm and surfaces outside the recesses;
   applying metal of the vaporizer surface; and
   uniformly wetting the plurality of recesses and the outside surfaces with molten metal simultaneously in longitudinal and lateral directions of the vaporizing surface.

11. The method of claim 10, wherein the recesses distribute the molten metal along the longitudinal and lateral directions of the surfaces outside the recesses.

12. The method of claim 10, wherein the outside surfaces distribute the molten metal to one or more of the recesses.

13. The method of claim 10, wherein a cavity is formed in the vaporizing surface, and the recesses are formed in a bottom surface of the cavity.

14. The method of claim 10, wherein at least one of the recesses comprises curvature between a bottom surface and side-wall of the recesses, the curvature having radius of 0.1 mm to 1 mm.

15. The method of claim 10, wherein the circular recesses have a radius of at least 3 mm.

16. The method of claim 10, wherein the metal is applied to the vaporizer surface in a non-central location.

17. The method of claim 16, wherein the entire vaporizer surface is uniformly wetted with the molten metal.

* * * * *